(12) United States Patent
Yamada et al.

(10) Patent No.: US 9,969,909 B2
(45) Date of Patent: May 15, 2018

(54) ADHESIVE SHEET FOR SEMICONDUCTOR, AND DICING TAPE INTEGRATED ADHESIVE SHEET FOR SEMICONDUCTOR

(75) Inventors: Masaki Yamada, Ichihara (JP); Michio Mashino, Ichihara (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days. days.

(21) Appl. No.: 12/741,117

(22) PCT Filed: Nov. 7, 2008

(86) PCT No.: PCT/JP2008/070268
§ 371 (c)(1),
(2), (4) Date: May 3, 2010

(87) PCT Pub. No.: WO2009/060927
PCT Pub. Date: May 14, 2009

(65) Prior Publication Data
US 2010/0266842 A1 Oct. 21, 2010

(30) Foreign Application Priority Data
Nov. 8, 2007 (JP) .............................. P2007-290680

(51) Int. Cl.
| | |
|---|---|
| *C09J 11/04* | (2006.01) |
| *C09J 7/00* | (2018.01) |
| *C09J 133/08* | (2006.01) |
| *H01L 21/683* | (2006.01) |
| *H01L 23/00* | (2006.01) |
| *C08L 9/00* | (2006.01) |
| *C08L 13/00* | (2006.01) |
| *H01L 21/67* | (2006.01) |

(52) U.S. Cl.
CPC ................ *C09J 11/04* (2013.01); *C09J 7/00* (2013.01); *C09J 133/08* (2013.01); *H01L 21/6836* (2013.01); *H01L 24/27* (2013.01); *H01L 24/29* (2013.01); *H01L 24/83* (2013.01); *C08K 3/013* (2018.01); *C08L 9/00* (2013.01); *C08L 13/00* (2013.01); *C09J 2203/326* (2013.01); *C09J 2205/102* (2013.01); *C09J 2409/00* (2013.01); *H01L 21/67132* (2013.01); *H01L 2221/68327* (2013.01); *H01L 2224/27436* (2013.01); *H01L 2224/2919* (2013.01); *H01L 2224/2929* (2013.01); *H01L 2224/29386* (2013.01); *H01L 2224/8385* (2013.01); *H01L 2224/83191* (2013.01); *H01L 2924/00013* (2013.01); *H01L 2924/0102* (2013.01); *H01L 2924/01005* (2013.01); *H01L 2924/01006* (2013.01); *H01L 2924/01012* (2013.01); *H01L 2924/01013* (2013.01); *H01L 2924/01015* (2013.01); *H01L 2924/01027* (2013.01); *H01L 2924/01032* (2013.01); *H01L 2924/01033* (2013.01); *H01L 2924/01045* (2013.01); *H01L 2924/01047* (2013.01); *H01L 2924/01051* (2013.01); *H01L 2924/01082* (2013.01); *H01L 2924/0665* (2013.01); *H01L 2924/07802* (2013.01); *H01L 2924/12042* (2013.01); *H01L 2924/181* (2013.01); *H01L 2924/351* (2013.01); *Y10T 428/2852* (2015.01)

(58) Field of Classification Search
CPC ..................................... C09J 7/00; C09J 11/04
USPC ...................................... 428/343, 354, 355 R
See application file for complete search history.

(56) References Cited

U.S. PATENT DOCUMENTS

| | | | | |
|---|---|---|---|---|
| 4,923,910 | A * | 5/1990 | Kitagawa | ............. C08G 59/184 523/428 |
| 7,247,381 | B1 | 7/2007 | Watanabe et al. | |
| 2003/0069331 | A1 | 4/2003 | Inada et al. | |
| 2003/0145949 | A1 | 8/2003 | Tanaka et al. | |
| 2003/0159773 | A1* | 8/2003 | Tomiyama et al. | ........... 156/248 |
| 2006/0128065 | A1 | 6/2006 | Inada et al. | |
| 2007/0026572 | A1* | 2/2007 | Hatakeyama et al. | ........ 438/113 |
| 2007/0276079 | A1* | 11/2007 | Saiki et al. | .................... 524/493 |
| 2010/0093154 | A1* | 4/2010 | Amano | ............. C08G 18/4045 438/464 |

(Continued)

FOREIGN PATENT DOCUMENTS

| | | |
|---|---|---|
| CN | 1322229 A | 11/2001 |
| CN | 1400993 | 3/2003 |
| CN | 1799126 | 7/2006 |

(Continued)

OTHER PUBLICATIONS

Translation of the Preliminary Report on Patentability dated Jul. 8, 2010, for International (PCT) Application No. PCT/JP2008/070268.

(Continued)

*Primary Examiner* — Victor S Chang

(74) *Attorney, Agent, or Firm* — Fitch, Even, Tabin & Flannery, LLP

(57) ABSTRACT

There is provided an adhesive sheet for a semiconductor and a dicing tape integrated adhesive sheet for a semiconductor that are each good in cuttability when the sheets are each cut into individual pieces by expansion and are each good in embeddability into irregularities in a wiring board when the sheets are each molded thereto. An adhesive sheet for a semiconductor includes a resin composition containing a high-molecular-weight component and a filler, the breaking elongation of the adhesive sheet before curing is 40% or less at 0° C., and the elastic modulus of the adhesive sheet after curing is from 0.1 to 10 MPa at 175° C.

22 Claims, No Drawings

(56) References Cited

U.S. PATENT DOCUMENTS

2010/0167073 A1* 7/2010 Kitakatsu ................ 428/473.5

FOREIGN PATENT DOCUMENTS

| | | |
|---|---|---|
| EP | 1 120 449 | 8/2001 |
| EP | 1209211 | 5/2002 |
| JP | 2001-302998 | 10/2001 |
| JP | 2003-41206 | 2/2003 |
| JP | 2004-43761 | 2/2004 |
| JP | 2005-60584 | 3/2005 |
| JP | 2006-93213 | 4/2006 |
| JP | 2007-284670 | 11/2007 |
| JP | 2007-288174 | 11/2007 |
| JP | 2008-147641 | 6/2008 |
| KR | 20060021337 | 3/2006 |
| WO | WO 00/78887 | 12/2000 |
| WO | WO 01/60938 | 8/2001 |

OTHER PUBLICATIONS

Chinese Official Action dated Jun. 22, 2011, for CN Application No. 200880111454.9.
Extended European Search Report dated Jun. 8, 2012, including a Supplementary European Search Report and European Search Opinion, for EP Application No. 08847953.0-2102/2219212 (PCT/JP2008/070268).
Japanese Official Action dated Nov. 13, 2012, for JP Application No. 2009-540093.
Chinese Official Action dated Jul. 21, 2014, for CN Application No. 2012100034649.
Korean Official Action dated Sep. 18, 2014, for KR Application No. 10-2010-7008099.

* cited by examiner

ADHESIVE SHEET FOR SEMICONDUCTOR, AND DICING TAPE INTEGRATED ADHESIVE SHEET FOR SEMICONDUCTOR

TECHNICAL FIELD

The present invention relates to an adhesive sheet for a semiconductor, and a dicing tape integrated adhesive sheet for a semiconductor.

BACKGROUND ART

Hitherto, silver paste has been mainly used in order to bond a semiconductor element and a semiconductor-element-mounting supporting member to each other. However, as the size of semiconductor elements has been made smaller and the performance thereof has been made higher in recent years, supporting members used therein have also been required to be made smaller and minuter. Against such requirements, the following have been caused according to silver paste: at the time of wire bonding, an inconvenience is caused by a matter that the paste is pushed or forced out or by an inclination of the semiconductor element; the film thickness of the adhesive sheet is not easily controlled; voids are generated in the adhesive sheet; and others are caused. Thus, it has been becoming difficult that silver paste copes with the requirements. For this reason, in order to cope with the requirements, the use of an adhesive in a sheet form has been spreading in recent years.

This adhesive sheet is used in an individual-piece-adhering manner or in a wafer-rear-surface adhesion manner. When the former, i.e., the individual-piece-adhering manner adhesive sheet is used to produce a semiconductor device, the adhesive sheet, which is in a reel form, is cut or punched into individual pieces. Thereafter, any one of the pieces is bonded onto a supporting member. Onto the resultant adhesive-sheet-attached supporting member is then bonded one out of individual semiconductor elements divided in a dicing step, so as to produce a semiconductor-element-attached supporting member. Thereafter, the member is optionally caused to undergo a wire bonding step, a sealing step, and some other step, thereby yielding the semiconductor device. However, in order to use the individual-piece-adhering manner adhesive sheet, it is indispensable to cut the adhesive sheet into the individual pieces, and a special fabricating apparatus for bonding any one of the pieces onto the supporting member is required. Thus, there remains a problem that costs for the production are higher than according the method using silver paste.

On the other hand, when the latter, i.e. the wafer-rear-surface adhesion manner adhesive sheet is used to produce a semiconductor device, the semiconductor device is yielded through the following process: first, the adhesive sheet is adhered onto the rear surface of a semiconductor wafer and further a dicing tape is adhered onto the other surface of the adhesive sheet; thereafter, the wafer is diced into individual semiconductor elements; any one of the adhesive-sheet-attached semiconductor elements is picked up, and the element is bonded onto a supporting member; and the workpiece is caused to undergo heating, curing and wire bonding steps, and some other step. This wafer-rear-surface adhesion manner adhesive sheet does not require any device for dividing the adhesive sheet into individual pieces in order to bond the adhesive-sheet-attached semiconductor element onto the supporting member. Thus, a conventional fabricating apparatus for silver paste may be used as it is, or the apparatus may be used in the state that the apparatus is partially improved, for example, a heat plate is added thereto. For this reason, attention has been paid to the method, as a method for controlling costs for the production into a relatively low level, out of fabricating methods using an adhesive sheet.

However, in the method using a wafer-rear-surface adhesion manner adhesive sheet, it is necessary that the adhesive sheet is also cut in the step of dicing the wafer. Examples of the method for cutting this adhesive sheet include a contact-manner cutting method of attaining the cutting using a diamond blade; a method of irradiating the wafer with a laser to form a reformed region selectively inside the wafer, and subsequently expanding the wafer, whereby the adhesive sheet is cut at the same time when the wafer is cut along the reformed region; and a method of cutting the wafer, adhering the adhesive sheet onto the cut wafer, and then expanding the wafer to cut the adhesive sheet along the wafer-cut lines (see, for example, Japanese Patent Application Laid-Open No. 2006-093213). In any one of the methods, however, it is said to be effective to add an inorganic filler to the adhesive sheet so as to adjust the sheet into an appropriate hardness, thereby improving the cuttability thereof since it is difficult to cut the wafer, which is an inorganic material and is hard, and the adhesive sheet, which is an organic material and is soft, according to the same step.

One of the most important properties for mount boards, on each of which various electronic components, a typical example of which is a semiconductor element, are mounted, is reliability. In particular, connection reliability against thermal fatigue is a very important item since the reliability is related directly to the reliability of an instrument using a mount board. A cause for lowering this connection reliability is thermal stress generated from a matter that various materials different from each other in thermal expansion coefficient are used. Since the thermal expansion coefficient of semiconductor elements is as small as about 4 ppm/° C. while the thermal expansion coefficient of wiring boards, on each of which electronic components are to be mounted, is as large as about 15 ppm/° C. or more, thermal strain is generated against thermal impact so that thermal stress is generated by the thermal strain. This thermal stress causes a decline in the connection reliability. For this reason, it is a theme for adhesive sheets to relieve this thermal stress. Such a wiring board generally has irregularities based on wiring. An adhesive sheet needs to be embedded into the irregularities in this wiring board when bonded thereto. For any adhesive sheet for a semiconductor, from the viewpoint of the thermal-stress-relieving performance thereof and the embeddability into irregularities in a wiring board, and other viewpoints, it is desired that the elastic modulus is somewhat low after the curing of the sheet. However, it is known that when an inorganic filler is added thereto in order to improve the cuttability of the adhesive sheet, the elastic modulus of the adhesive sheet generally becomes high. Thus, it becomes a theme to make the reliability of a semiconductor package and the cuttability of its adhesive sheet compatible with each other.

An object of the invention is to provide an adhesive sheet for a semiconductor and a dicing tape integrated adhesive sheet for a semiconductor that are each good in cuttability when the sheets are each cut into individual pieces by expansion and are each good in embeddability into irregularities in a wiring board when the sheets are each bonded thereto, so as to exhibit an excellent reliability.

DISCLOSURE OF THE INVENTION

In each of conventional adhesive sheets, an inorganic filler is added to a resin composition to make the breaking elongation small before the adhesive sheet is cured in order to make it possible to divide the adhesive sheet into individual pieces by expansion. However, the high-temperature elastic modulus becomes high after the curing, so that the embeddability into irregularities in a wiring board is poor.

The inventors have made eager investigations, so as to find out that the breaking elongation of an adhesive sheet at 0° C. can be kept small before the sheet is cured, and further the high-temperature elastic modulus can be made low after the curing. Thus, the invention has been made.

The invention relates to (1) an adhesive sheet for a semiconductor, including a resin composition containing a high-molecular-weight component and a filler, the breaking elongation of the adhesive sheet before the sheet is cured being 40% or less at 0° C., and the elastic modulus (i.e. the modulus of elasticity) of the adhesive sheet after the curing being from 0.1 to 10 MPa at 175° C.

The invention relates to (2) the adhesive sheet for a semiconductor according to item (1), wherein the high-molecular-weight component has a Tg of −10 to 60° C. and a weight-average molecular weight of 20000 to 1000000.

The invention relates to (3) the adhesive sheet for a semiconductor according to item (1) or (2), wherein when the total amount of the resin composition is regarded as 100% by weight, the resin composition contains 50 to 65% by weight of the high-molecular-weight component and 35 to 50% by weight of the filler.

The invention relates to (4) the adhesive sheet for a semiconductor according to item (3), wherein the filler contains a filler wherein the average particle diameter of primary particles is from 0.005 to 0.1 μm.

The invention relates to (5) the adhesive sheet for a semiconductor according to item (4), wherein the filler, wherein the average particle diameter of the primary particles is from 0.005 to 0.1 μm, is contained in the resin composition in an amount of 1 to 15% by weight.

The invention relates to (6) the adhesive sheet for a semiconductor according to any one of items (1) to (5), wherein the resin composition contains a low-molecular-weight polymer.

The invention relates to (7) the adhesive sheet for a semiconductor according to item (6), wherein the low-molecular-weight polymer has a weight-average molecular weight of 1000 to 10000.

The invention relates to (8) the adhesive sheet for a semiconductor according to item (6) or (7), wherein the low-molecular-weight polymer is a butadiene polymer having, at a terminal thereof, a carboxyl group.

The invention relates to (9) a dicing tape integrated adhesive sheet for a semiconductor, wherein an adhesive sheet for a semiconductor as recited in any one of items (1) to (8), and a dicing tape are laminated onto each other.

According to the invention, an adhesive sheet for a semiconductor and a dicing tape integrated adhesive sheet for a semiconductor are obtained which are each good in cuttability by expansion in the step of attaining division into individual adhesive-sheet-attached semiconductor elements when semiconductor devices are produced, and are each good in embeddability into irregularities in a wiring board when the sheets are each bonded thereto, so as to exhibit an excellent reliability.

BEST MODE FOR CARRYING OUT THE INVENTION

The adhesive sheet of the invention for a semiconductor is an adhesive sheet for a semiconductor including a resin composition containing a high-molecular-weight component and a filler, the breaking elongation of the adhesive sheet before the sheet is cured being 40% or less at 0° C., and the elastic modulus of the adhesive sheet after the curing being from 0.1 to 10 MPa at 175° C.

The adhesive sheet before the sheet is cured denotes the adhesive sheet that is in a B stage state.

For the adhesive sheet for semiconductor of the invention, it is important that the breaking elongation of the adhesive sheet before the sheet is cured is 40% or less at 0° C. If the breaking elongation is more than 40%, the cuttability of the adhesive sheet by expansion is poor. The breaking elongation is preferably 35% or less, more preferably 30% or less.

The breaking elongation may be obtained by using a Tensilon (UTM-III-500, manufactured by Toyo Baldwin) to pull an adhesive sheet having a thickness of 40 μm before the sheet is cured under conditions that the distance between chucks is 20 mm, the pulling speed is 3 mm/minute and the temperature is 0° C., measuring the length of the adhesive sheet when the sheet is broken, and then making a calculation in accordance with the following equation:

$$\text{Breaking elongation (\%)} = (\text{length (mm) of the adhesive sheet when the sheet is broken} - 20)/20 \times 100$$

In order to set the breaking elongation of the adhesive sheet of the invention to 40% or less at 0° C. before the adhesive sheet is cured, it is advisable to adjust the contents by percentage of the high-molecular-weight component and the filler in the resin composition. Specifically, it is effective to make the content by percentage of the high-molecular-weight component in the resin composition low and further make that of the filler therein high. It is more effective to set the content by percentage of the high-molecular-weight component in the resin composition to 65% or less by weight and further set that of the filler therein to 35% or more by weight. It is particularly effective to set the content by percentage of the high-molecular-weight component into the range of 50 to 65% by weight and further set that of the filler into the range of 35 to 50% by weight.

For the adhesive sheet for semiconductor of the invention, it is important that the elastic modulus of the adhesive sheet after the curing is from 0.1 to 10 MPa at 175° C. If the elastic modulus is less than 0.1 MPa, the reliability declines. If the elastic modulus is more than 10 MPa, the embeddability into irregularities in a wiring board declines. The elastic modulus is preferably from 1 to 9 MPa, more preferably from 3 to 8 MPa.

The elastic modulus may be measured by using a dynamic viscoelasticity meter (DVE-V4, manufactured by Rheology Co., Ltd.) to apply a tensile load (10 g) to a cured product obtained by curing an adhesive sheet (width: 4 mm, and thickness: 40 μm) at 175° C. for 3 hours, and then carrying out a temperature-dependency measuring mode in which measurements are made in the range of 25 to 300° C. at a distance between chucks of 20 mm, a frequency of 10 Hz and a temperature-raising rate of 3° C./minute.

In order to set the elastic modulus of the adhesive sheet of the invention after the sheet is cured into the range of 0.1 to 10 MPa at 175° C., it is advisable to adjust the contents by percentage of the high-molecular-weight component and the filler in the resin composition. Specifically, it is effective to make the content by percentage of the high-molecular-weight component in the resin composition high and further make that of the filler therein low. It is more effective to set the content by percentage of the high-molecular-weight component in the resin composition to 50% or more by weight and further set that of the filler therein to 50% or less by weight. It is particularly effective to set the content by percentage of the high-molecular-weight component into the range of 50 to 65% by weight and further set that of the filler into the range of 35 to 50% by weight.

The adhesive sheet of the invention includes a resin composition containing a high-molecular-weight component and a filler.

About the high-molecular-weight component, the Tg (glass transition temperature) is preferably from −10 to 60° C., more preferably from −5 to 10° C., in particular preferably from 0 to 5° C. In a case where the Tg is set to −10° C. or higher, at the time when the adhesive sheet integrated with a dicing tape is expanded the dicing tape is prevented from being broken. In a case where the Tg is set to 60° C. or lower, the softening of the adhesive sheet is restrained. Thus, the adhesive sheet is satisfactorily cut with ease when expanded.

About the high-molecular-weight component, the weight-average molecular weight is preferably from 20,000 to 1,000,000, more preferably from 100,000 to 900,000, in particular preferably from 500,000 to 800,000. When the weight-average molecular weight is set to 20,000 or more, a fall in the strength and the flexibility of the adhesive sheet is restrained, and an increase in the tackiness is prevented. When the weight-average molecular weight is set to 1,000,000 or less, the solubility of the resin composition into a solvent does not lower so that the workability is improved. The weight-average molecular weight is a polystyrene converted value according to gel permeation chromatography (GPC) wherein a calibration curve based on standard polystyrene is used.

When the total amount of the resin composition is regarded as 100% by weight, the content by percentage of the high-molecular-weight component is from 50 to 65% by weight, more preferably from 52 to 63% by weight, in particular preferably from 53 to 60% by weight. If the content by percentage is less than 50% by weight, the elastic modulus of the adhesive sheet at 175° C. becomes high after the sheet is cured. Thus, the embeddability into irregularities in a wiring board may decline. If the content by percentage is more than 65% by weight, the breaking elongation of the adhesive sheet at 0° C. becomes large before the curing. Thus, the cuttability of the adhesive sheet by expansion is poor so that the division of the sheet into individual pieces may become difficult. Moreover, the elastic modulus of the adhesive sheet at 175° C. lowers after the curing, so that the reliability may decline.

Examples of the high-molecular-weight component used in the invention include polyamide resin, polyimide resin, polyamideimide resin, and acrylic copolymer. Preferred is an epoxy-group-containing acrylic copolymer containing a functional monomer incompatible with epoxy resin, such as glycidyl acrylate or glycidyl methacrylate. In the case of using an acrylic copolymer containing, as a functional monomer, a carbonic acid type monomer such as acrylic acid, or a hydroxyl group type monomer such as hydroxymethyl(meth)acrylate, crosslinking reaction advances easily so as to result unfavorably in a problem that the resin composition is gelatinized in a varnish state, a problem that before the film is cured, the curing degree rises so that the adhesive force falls, and other problems.

The content by percentage of glycidyl(meth)acrylate contained in the epoxy-group-containing acrylic copolymer is preferably from 1 to 6% by weight, more preferably from 2 to 5% by weight. When the content by percentage is set to 1% or more by weight, a fall in the adhesive property is prevented. When the content by percentage is set to 6% or less by weight, the gelatinization is easily restrained. The content by percentage of the glycidyl(meth)acrylate is the proportion of the weight of the glycidyl(meth)acrylate to the total weight of the monomers containing the copolymer.

The Tg of the epoxy-group-containing acrylic copolymer is preferably from −10 to 60° C. When the Tg is set to −10° C. or higher, an increase in the tackiness of the adhesive layer is prevented before the curing, so that the handleability becomes good. On the other hand, when the Tg is set to 60° C. or lower, the softening of the adhesive sheet is restrained so that the adhesive sheet is satisfactorily cut with ease when expended. The weight-average molecular weight of the epoxy-group-containing acrylic copolymer is preferably 500,000 or more, more preferably from 600,000 to 800,000 from the viewpoint of heat resistance. The epoxy-group-containing acrylic copolymer is not particularly limited, and may be a product (trade name: HTR-860P-3DR) commercially available from Nagase ChemteX Corp., or the like. The method for yielding the epoxy-group-containing acrylic copolymer by synthesis may be a method of using, as monomers, glycidyl(meth)acrylate, and ethyl(meth)acrylate, butyl methacrylate or a mixture of the two, and polymerizing the monomers by a known method such as pearl polymerization or solution polymerization.

In the invention, the resin composition contains a filler from the viewpoint of heat resistance. The filler is not particularly limited, and is preferably an inorganic filler. Examples thereof include aluminum hydroxide, magnesium hydroxide, calcium carbonate, magnesium carbonate, calcium silicate, magnesium silicate, calcium oxide, magnesium oxide, alumina, aluminum nitride, aluminum borate whisker, boron nitride, crystalline silica, amorphous silica, and antimony oxide. In order to improve the thermal conductivity, preferred are alumina, aluminum nitride, boron nitride, crystalline silica, amorphous silica and so on. In order to adjust the melt viscosity and giving thixotropy, preferred are aluminum hydroxide, magnesium hydroxide, calcium carbonate, magnesium carbonate, calcium silicate, magnesium silicate, calcium oxide, magnesium oxide, alumina, crystalline silica, amorphous silica, and so on. In order to improve the humidity resistance, preferred are alumina, silica, aluminum hydroxide, antimony oxide and so on. Of these examples, silica is more preferred from the viewpoint of the multi-usability thereof.

When the total amount of the resin composition is regarded as 100% by weight, the content by percentage of the filler is preferably from 35 to 50% by weight, more preferably from 27 to 48% by weight, in particular preferably from 27 to 40% by weight. If the content by percentage is less than 35% by weight, it becomes difficult to make the breaking elongation of the adhesive sheet at 0° C. small before the sheet is cured. If the content by percentage is more than 50% by weight, the wettability of the adhesive sheet declines so that the wafer attachability and the reliability may fall.

The average particle diameter of the filler is not particularly limited. The average particle diameter of primary particles thereof is preferably from 0.005 to 10 μm. When the average particle diameter is set to 10 μm or less, the adhesive sheet is easily made thin. When the diameter is set to 0.005 μm or more, the workability becomes good. In order to make the content by percentage of the filler high to make the elastic modulus and the embeddability good, it is preferred to use a mixture of plural filler species having particle diameter distributions different from each other as far as the average particle sizes thereof are in the above-mentioned average particle diameter range. In order to make the breaking elongation of the adhesive sheet at 0° C. small before the sheet is cured, it is preferred that the resin composition contains a filler about which the average particle diameter of primary particles thereof is from 0.005 to 0.1 µm; it is more preferred that the composition contains a filler about which the diameter is from 0.010 to 0.05 µm; and it is particularly preferred that the composition contains a filler about which the diameter is from 0.015 to 0.03 µm. In the resin composition, the filler about which the average particle diameter of primary particles thereof is from 0.005 to 0.1 µm is contained preferably in an amount of 1 to 15% by weight, more preferably in an amount of 2 to 13% by weight. When this content by percentage is set to 1% or more by weight, the breaking elongation is easily made small. When the content by percentage is set to 15% or less by weight, a fall in the tackiness of the adhesive layer is prevented, so that the handleability becomes good.

The average particle diameter may be measured by particle diameter distribution measurement using, for example, a laser ray diffraction method. The average particle diameter may be obtained as the median diameter.

In the invention, the resin composition preferably contains a resin component from the viewpoint of adhesive property. Examples of the resin component include acrylic resin, methacrylic resin, phenoxy resin, epoxy resin, phenol resin, cresol resin, and cyanate resin. In order to improve the heat resistance, the resin component preferably contains a thermosetting functional group. Of the resins, epoxy resin is preferred. Examples of the epoxy resin include bisphenol A type epoxy resins, such as products (trade names: EPI-COATs 1001, 1002, 1003, 1055, 1004, 1004AF, 1007, 1009, 1003F, and 1004F) manufactured by Yuka-Shell Epoxy Co., Ltd., and products (trade names: D.E.R.'s 661, 662, 663U, 664, 664U, 667, 642U, 672U, 673MF, 668, and 669) manufactured by Dow Chemical Japan Ltd.; bisphenol F type epoxy resins, such as products (trade names: YDF-2004, and YDF-8170C) manufactured by Tohto Kasei Co., Ltd.; phenol Novolak type epoxy resins, such as a product (trade name: EPPN-201) manufactured by Nippon Kayaku Co., Ltd.; cresol Novolak type epoxy resins, such as a product (trade name: EPICOAT 180565 manufactured by Yuka-Shell Epoxy Co., Ltd., products (trade names: ARALDITE ECNs 1273, 1280, and 1299) manufactured by Ciba Specialty Chemicals Inc., products (trade names: YDCNs-701, -702, -703, -704, and -700-10) manufactured by Tohto Kasei Co., Ltd., products (trade names: EOCNs-1020, -102S, -103S, and -104S) manufactured by Nippon Kayaku Co., Ltd., and products (trade names: ESCNs-195X, -200L, and 220) manufactured by Sumitomo Chemical Co., Ltd.; polyfunctional epoxy resins, such as products (trade names: Epon 1031 S, and EPICOATs 1032H60 and 157S70) manufactured by Yuka-Shell Epoxy Co., Ltd., and products (trade names: EPPNs. 501H, and 502H) manufactured by Nippon Kayaku Co., Ltd.; and heteroring-containing epoxy resins, such as a product (trade name: ARALDITE PT810) manufactured by Ciba Specialty Chemicals Inc. However, the epoxy resin is not limited thereto.

The weight-average molecular weight of the epoxy resin is not particularly limited, and is preferably from 400 to 10,000, more preferably from 500 to 5,000, in particular preferably from 600 to 3,000. If the weight-average molecular weight is less than 400, the resin is a low-viscosity liquid in many cases. Thus, the breakability of the adhesive sheet may be lowered. If the weight-average molecular weight is more than 10000, molecules of the resin are entangled with each other to the accompaniment of the rise in the molecular weight. Thus, the solubility in a solvent falls so that the workability deteriorates easily.

When a thermosetting resin is used as the resin component, it is preferred to use a curing agent together and it is more preferred to use a curing promoter together.

The curing agent used in the invention is not particularly limited as far as the agent is a curing agent that is ordinarily used as a curing agent for thermosetting resin. Examples thereof include amines, polyamides, acid anhydrides, polysulfides, boron trifluoride, bisphenols each having in a single molecule thereof two or more phenolic hydroxyl groups, such as bisphenol A, bisphenol F and bisphenol S, and phenol resins, such as phenol Novolak resin, bisphenol A Novolak resin and cresol Novolak resin.

Of these examples, phenol resins are preferred from the viewpoint of the heat resistance thereof. More preferred is a phenol resin wherein the water absorption is 2% or less by weight, the absorption being a water absorption after the resin is put in a constant-temperature and constant-humidity tank having a temperature of 85° C. and a relative humidity 85% for 48 hours. Furthermore, particularly preferred is a phenol resin wherein the heating mass reduction ratio (temperature-raising rate: 5° C./minute, and atmosphere: nitrogen) measured with a thermogravimeter (TGA) is less than 5% by weight at 350° C. This phenol resin is obtained by reacting a phenolic compound and a xylylene compound, which is a bivalent linking group, to react with each other in the presence of no catalyst or an acid catalyst. Examples of commercially available products thereof include products (trade names: MILEX XLC-series and XL series) manufactured by Mitsui Chemicals, Inc.

The blend ratio between the thermosetting resin and the curing agent is not particularly limited. It is preferred from a stoichiometric viewpoint that the reactive group equivalents thereof are equal to each other.

The curing promoter used in the invention is not particularly limited, and examples thereof include quaternary phosphonium salts, quaternary ammonium salts, imidazoles, DBU aliphatic acid salts, metal chelates, metal salts, and triphenylphosphines. These may be used alone or in combination of two or more thereof. Of these curing promoters, imidazoles are preferred. Specific examples thereof include 2-methylimidazole, 2-ethyl-4-methylimidazole, 1-cyanoethyl-2-phenylimidazole, 1-cyanoethyl-2-phenylimidazolium trimellitate.

The addition amount of the curing promoter is preferably from 0.001 to 5 parts by weight, more preferably from 0.05 to 3 parts by weight for 100 parts by weight of the whole of the thermosetting resin and the curing agent.

In the invention, it is preferred from the viewpoint of breakability that the resin composition contains a low-molecular-weight polymer. The weight-average molecular weight of the low-molecular-weight polymer is not particularly limited, and is preferably from 1000 to 10,000, more preferably from 2000 to 10,000, in particular preferably from 3000 to 5000. If the weight-average molecular weight is less than 1000, the polymer is a low-viscosity liquid in many cases so that the polymer may cause a fall in the breakability of the adhesive sheet. If the weight-average molecular weight is more than 10,000, molecules of the resin are entangled with each other to the accompaniment of the rise in the molecular weight. Thus, the breakability of the adhesive sheet may be lowered.

The low-molecular-weight polymer used in the invention preferably contains a butadiene homopolymer or copolymer having, at a terminal thereof, a carboxyl group. Examples of such a polymer that can be preferably used include products (Hycar CTB-2009×162, CTBN-1300×31, CTBN-1300×8, CTBN-1300×13, CTBNX-1300×9) each manufactured by Ube Industries, Ltd.), which are acrylonitrile polybutadiene copolymers each having, at a terminal thereof, a carboxyl group; and a product (NISSO-PB-C-2000) manufactured by Nippon Soda Co., Ltd., which is a liquid polybutadiene having, at a terminal thereof, a carboxyl group. These may be used alone or in combination of two or more thereof.

In the invention, the resin composition preferably contains a coupling agent that may be of various types in order to make interfacial bonding between (the) materials different from each other good. Examples of the coupling agent include silane coupling agents, titanium based coupling agents, and aluminum based coupling agents. Silane coupling agents are most preferred.

The silane coupling agents are not particularly limited. The following may be used: vinylsilanes such as vinyltrichlorosilane, vinyltris(β-methoxyethoxy)silane, vinyltriethoxysilane, and vinyltrimethoxysilane; methacryloylsilanes such as γ-methacryloxypropyltrimethoxysilane, γ-methacryloxypropylmethyldimethoxysilane, 3-methacryloxypropyl-trimethoxysilane, and methyltri(methacryloyloxyethoxy)silane; epoxy-group-containing silanes such as β-(3,4-epoxycyclohexyl)ethyltrimethoxysilane, γ-glycidoxypropyltrimethoxysilane, γ-glycidoxypropylmethyldimethoxysilane, γ-glycidoxypropylmethyldiethoxysilane, and methyltri(glycidyloxy)silane; aminosilanes such as N-β(aminoethyl)γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, 3-aminopropylmethyldiethoxysilane, 3-aminopropyltrimethoxysilane, 3-aminopropyl-tris(2-methoxy-ethoxyethoxy)silane, N-methyl-3-aminopropyltrimethoxysilane, triaminopropyl-trimethoxysilane, 3-4,5-dihydroimidazole-1-yl-propyltrimethoxysilane, and amyltrichlorosilane; mercaptosilanes such as γ-mercaptopropyltrimethoxysilane, γ-mercaptopropyltriethoxysilane, and 3-mercaptopropylmethyldimethoxysilane; urea-bond-containing silanes such as 3-ureidopropyltriethoxysilane, and 3-ureidopropyltrimethoxysilane; isocyanate-group-containing silanes such as trimethylsilyl isocyanate, dimethylsilyl isocyanate, methylsilyl triisocyanate, vinylsilyl triisocyanate, phenylsilyl triisocyanate, tetraisocyanate silane, and ethoxysilane isocyanate; and 3-chloropropyl-methyldimethoxysilane, 3-chloropropyl-dimethoxysilane, 3-cyanopropyl-triethoxysilane, hexamethyldisilazane, N,O-bis(trimethylsilyl)acetoamide, methyltrimethoxysilane, methyltriethoxysilane, ethyltrichlorosilane, n-propyltrimethoxysilane, isobutyltrimethoxysilane, octyltriethoxysialne, phenyltrimethoxysilane, phenyltriethoxysilane, N-β(N-vinylbenzylaminoethyl)-γ-aminopropyltrimethoxysilane, octadecyldimethyl[3-(trimethoxysilyl)propyl]ammonium chloride, γ-chloropropylmethyldichlorosilane, γ-chloropropylmethyldimethoxysilane, and γ-chloropropylmethyldiethoxysilane. These coupling agents may be used alone or in combination of two or more thereof.

The adhesive sheet for semiconductor of the invention may be obtained by dissolving or dispersing, into a solvent, a resin composition containing a high-molecular-weight component, a filler, and optional other components to prepare a vanish, painting the vanish onto a support film, and heating the resultant to remove the solvent.

As the support film, the following may be used: a polytetrafluoroethylene film, a polyethylene terephthalate film, a polyethylene film, a polypropylene film, a polymethylpentene film, a polyethylene naphthalate film, a polyethersulfone film, a polyetheramide film, a polyetheramideimide film, a polyamide film, a polyamideimide film, and a polyimide film and other plastic films. As the need arises, these plastic films may be subjected to a surface treatment such as primer painting, UV treatment, corona discharge treatment, polishing treatment, etching treatment, or releasing treatment. It is allowable to peel the support film when the adhesive sheet is used, and then use only its adhesive layer, or use the support film and the adhesive layer in the state that they are laminated on each other, and subsequently remove the support film. The thickness of the support film is not particularly limited, and may be appropriately selected. The thickness is preferably from 10 to 100 μm.

The solvent used to prepare the varnish is not particularly limited as far as the solvent is a solvent wherein the individual components can be uniformly dissolved, mixed or dispersed. A solvent known in the prior art may be used. Considering the volatility when the adhesive sheet is formed, it is preferred to use a solvent having a relatively low boiling point, such as methyl ethyl ketone, acetone, methyl isobutyl ketone, 2-ethoxyethanol, toluene, xylene, butylcellosolve, methanol, ethanol, or 2-methoxyethanol. In order to improve the painted film property or attain some other purpose, a solvent having a relatively high boiling point may be added, examples thereof including dimethylacetoamide, dimethylformamide, N-methylpyrrolidone or cyclohexanone.

The use amount of the solvent is not particularly limited when the solvent is used to prepare the vanish. The solvent is removed from the adhesive sheet by heating and drying, or the like. The solvent amount after the adhesive sheet is prepared is preferably 2% or less by weight of the total, and is more preferably 1% or less by weight of the total from the viewpoint of workability.

For the preparation of the vanish when the resin composition contains a filler, it is preferred under the consideration of the dispersibility of the filler to use a crusher, a three-roll machine, a ball mill, a bead mill or the like. These may be used in combination. When the filler is beforehand mixed with the low-molecular-weight material(s) and then the high-molecular-weight material(s) is/are blended therewith, the period for the mixing can be made short. By preparing the vanish and then subjecting the vanish to vacuum deairing or the like, voids in the vanish can be removed.

The method for painting the vanish onto the support film may be a known method. Examples thereof include knife coating, roll coating, spray coating, gravure coating, bar coating, and curtain coating methods.

The thickness of the adhesive layer formed on the support film is preferably from 1 to 100 μm as the thickness of the film in a B stage state. However, the thickness is not limited thereto. When the film thickness is set to 1 μm or more, the film-formability becomes good. When the thickness is set to 100 μm or less, economical advantages are produced. About the adhesive layer in the adhesive sheet of the invention, two or more sublayers may be adhered onto each other to give a desired thickness. In this case, required are adhering-conditions not permitting the adhesive (sub)layers to be peeled from each other.

The thickness of the adhesive sheet of the invention is preferably from 1 to 100 μm. However, the thickness is not limited thereto. When the thickness of the sheet is set to 1 μm or more, the sheet shape is easily kept. When the thickness is set to 100 μm or less, the breakability becomes good.

The adhesive sheet of the invention may be used alone, or may be used, in an embodiment, as a dicing tape integrated adhesive sheet for a semiconductor wherein the adhesive sheet of the invention is laminated on a dicing tape known in the prior art. It is sufficient for this case that the step of attaining lamination onto a wafer is carried out only one time. Thus, the working efficiency can be raised.

Examples of the dicing tape used in the invention include a polytetrafluoroethylene film, a polyethylene terephthalate film, a polyethylene film, a polypropylene film, a polymethylpentene film, a polyimide film and other plastic films. As the need arises, the dicing film may be subjected to a surface treatment such as primer painting, UV treatment, corona discharge treatment, polishing treatment, or etching treatment. The dicing tape needs to have adhesiveness. An adhesive layer may be laid on a single surface of the dicing tape. This can be formed by painting, as a resin composition for the adhesive layer, a resin composition having an appropriate tackiness intensity obtained by adjusting, in particular, the proportion of a liquid component therein, and the Tg of a high-molecular-weight component therein, and then drying the painted composition.

The film thickness of the dicing tape is not particularly limited, and may be appropriately decided on the basis of the knowledge of those skilled in the art in accordance with the film thickness of the adhesive sheet, or the usage of the dicing tape integrated adhesive sheet. The thickness may be from 60 to 200 μm and is preferably from 70 to 170 μm since the thickness produces economical advantages and makes the handleability of the film good.

When the adhesive sheet of the invention is used to produce a semiconductor device, the adhesive sheet needs to have such an adhesive force that at the time of the dicing (or when the sheet integrated with a dicing tape is diced), a semiconductor element thereon is not scattered, and needs to be peeled from the dicing tape at a subsequent picking-up time. For example, when the tackiness of the adhesive sheet or the dicing tape is too high so that the peel strength when the two are adhered onto each other is 150 N/m or more, it may be difficult to separate the two from each other. It is therefore preferred to adjust the tackiness intensity of the adhesive sheet appropriately. It is sufficient for a method therefor to use the following tendency: by raising the fluidity of the adhesive sheet at room temperature, the adhesive strength and the tackiness intensity are also raised; and by lowering the fluidity, the adhesive strength and the tackiness intensity are also lowered. For example, when the fluidity is raised, the method may be an increase in the content by percentage of a plasticizer, an increase in the content by percentage of a tacky agent, or some other method. Contrarily, when the fluidity is lowered, it is sufficient that the content by percentage of the plasticizer is decreased. Examples of the plasticizer include monofunctional acrylic monomers, monofunctional epoxy resins, liquid epoxy resins, acrylic resins, and the so-called epoxy diluting agents.

The peel strength of the dicing tape integrated adhesive sheet, wherein the adhesive sheet and a dicing tape are laminated on each other, is preferably less than 150 N/m, more preferably 50 N/m or less at time of the dicing. The method for laminating the adhesive sheet onto the dicing tape may be printing, or a roll laminating method of pressing the adhesive sheet, which is beforehand formed, onto the dicing tape to laminate the two onto each other. The laminate may be heated if necessary. The roll laminating method is preferred since a continuous production can be attained to give a good efficiency.

EXAMPLES

Hereinafter, the invention will be described in detail by way of examples; however, the invention is not limited thereto.

Examples 1 to 3, and Comparative Examples 1 to 8

<Formation of Adhesive Sheets>

Cyclohexanone was added to each composition containing the following: a cresol Novolak type epoxy resin (trade name: YDCN-700-100, manufactured by Tohto Kasei Co., Ltd.; epoxy equivalent: 210) or a BPF type epoxy resin (trade name: YDF-8170C, manufactured by Tohto Kasei Co., Ltd.; epoxy equivalent: 160) as an epoxy resin; a phenol resin (trade name: MILEX XLC-LL, manufactured by Mitsui Chemicals, Inc.; hydroxyl equivalent: 175, water absorption: 1.8%, and heating mass reduction ratio at 350° C.: 4%) or a phenol Novolak resin (trade name: LF-2882, manufactured by Dainippon Ink & Chemicals, Inc.) as a phenol resin; γ-ureidopropyltriethoxysilane (trade name: A-1160, manufactured by GE Toshiba Silicones Co., Ltd.) as a silane coupling agent; and a silica (trade name: SO-C2, manufactured by Admatechs Co., Ltd.; specific surface area: 7 $m^2/g$, and average particle diameter: 0.4 to 0.6 μm) or a silica (trade name: AEROSIL R972, manufactured by Nippon Aerosil Co., Ltd.; average particle diameter: 0.016 μm) as a filler, the amounts of which were predetermined amounts shown in Table 1. These components were then mixed while stirred, and further a bead mill was used to mix the components for 90 minutes.

The following were then incorporated into this mixture: an acrylic rubber having 2 to 6% by weight of glycidyl acrylate or glycidyl methacrylate (trade name: HTR-860P-3DR, manufactured by Nagase ChemteX Corp.; weight-average molecular weight: 700,000, and Tg: 5° C.) as a high-molecular-weight component; an acrylonitrile polybutadiene copolymer having at its terminal a carboxyl group (trade name: CTBNX-1300×9, manufactured by Ube Industries, Ltd.; weight-average molecular weight: 3,500) as a low-molecular-weight polymer; and 1-cyanoethyl-2-phenylimidazole (trade name: CURESOL 2PZ-CN, manufactured by Shikoku Chemicals Corp.) as a curing promoter, the amount of which were predetermined amounts shown in Table 1. The mixture was stirred and subjected to vacuum deairing to yield a vanish having a solvent content by percentage of 20%.

The vanish was painted onto a polyethylene terephthalate film subjected to releasing treatment, 75 μm in thickness, as a support film. The resultant was heated at 140° C. for 5 minutes to form a painted film, 40 μm in film thickness, in a B stage state (uncured). In this way, a support-film-attached adhesive sheet was produced.

Table 1 shows the blended parts by weight of the individual components in each of Examples 1 to 3 and Comparative Examples 1 to 8.

<Methods for Evaluating the Adhesive Sheets>

Each of the adhesive sheets yielded in Examples 1 to 3 and Comparative Examples 1 to 8 were evaluated about the following items:

(1) Breaking Elongation Before the Sheet was Cured

A Tensilon (UTM-III-500, manufactured by Toyo Baldwin) was used to pull the adhesive sheet which the support film was peeled, before the sheet was cured, 40 μm in thickness, under conditions that the distance between chucks was 20 mm, the pulling speed was 3 mm/minute and the temperature was 0° C., and then measure the length of the adhesive sheet when the sheet was broken. The breaking elongation (%) was obtained in accordance with an equation described below. The results are shown in Table 1.

Breaking elongation (%)=(length (mm) of the adhesive sheet when the sheet was broken−20)/20×100

(2) Elastic Modulus after the Sheet was Cured

A dynamic viscoelasticity meter (DVE-V4, manufactured by Rheology Co., Ltd.) was used to apply a tensile load (10 g) to a cured product obtained by curing the adhesive sheet (width: 4 mm, and thickness: 40 μm) at 175° C. for 3 hours and then peeling the support film, and then carry out a temperature-dependency measuring mode in which measurements were made in the range of from 25 to 300° C. at a distance between chucks of 20 mm, a frequency of 10 Hz and a temperature-raising rate of 3° C./minute. In this way, the elastic modulus was measured. The results are shown in Table 1.

(3) Cuttability of the Adhesive Sheet

An autograph (AGS-10000 manufactured by Shimadzu Corp.) was used, and the adhesive sheet from which the support film was peeled was thermally laminated onto a wafer at a temperature of 80° C. Thereafter, the wafer was notched at the center thereof with a diamond cutter to cut out only the wafer. The adhesive-sheet-attached wafer, which had the cut-out wafer, was cooled, and fitted to the autograph. The wafer was then expanded at 0° C., and the cuttability of the adhesive sheet was observed with the naked eye. Conditions for the expansion were as follows: the expansion rate was 50 mm/minute and the expansion amount was 1 mm. In a case where the adhesive sheet was able to be cut, the case is shown as "Good" in Table 1. In a case where the adhesive sheet was unable to be cut, the case is shown as "Bad" therein.

(4) Embeddability into Irregularities in a Wiring Board

The adhesive layer of the adhesive sheet of each of Examples 1 to 3 and Comparative Examples 1 to 8 was adhered onto a semiconductor wafer, and the support film was optionally peeled therefrom. Thereafter, the semiconductor wafer was adhered onto a commercially available ultraviolet curable dicing tape (trade name: UC-334EP-110, manufactured by The Furukawa Electric Co., Ltd.) through the adhesive layer. This dicing tape is a product wherein a tacky agent layer is formed on a substrate. At the time of the adhesion, the tacky layer of the dicing tape and the adhesive layer of the adhesive sheet were jointed with each other. Subsequently, a dicer was used to dice the semiconductor wafer and the adhesive layer, and then the resultant was irradiated with ultraviolet rays (at 500 mJ/cm$^2$) from the substrate side thereof. The adhesive layer and the tacky agent were then separated from each other to yield an adhesive-layer-attached semiconductor element. The resultant adhesive-layer-attached semiconductor element was heated and compressed onto a wiring board having irregularities, the average size of which was about 10 μm, at 150° C. through the adhesive layer while a force of 0.4×9.8 N was applied thereto for 3 seconds. Thereafter, in a case where the workpiece was a workpiece to be heated at high temperature, the workpiece was heated on a hot plate of 170° C. temperature for 1 hour so as to apply a thermal hysteresis equivalent to wire bonding to the workpiece.

Next, an epoxy sealing resin (trade name: CEL-9700HF, manufactured by Hitachi Chemical Co., Ltd.) was used to seal the workpiece at 180° C. and 6.75 MPa for 90 seconds. In this way, a sample of a semiconductor device was produced.

About each of the samples, an ultrasonic inspection imaging device was used, and the embeddability into irregularities in the wiring board after the resin-sealing was evaluated in accordance with whether or not voids were present between the adhesive layer and the wiring board. In a case where no voids were found is shown as "Good" in Table 1, and in a case where voids were found is shown as "Bad" therein.

TABLE 1

| | | Examples | | | Comparative Examples | | | | | | | |
| --- | --- | --- | --- | --- | --- | --- | --- | --- | --- | --- | --- | --- |
| | | 1 | 2 | 3 | 1 | 2 | 3 | 4 | 5 | 6 | 7 | 8 |
| Epoxy resin | YDCN-700-10 | 54 | 54 | 36 | 15 | 54 | 36 | 36 | 54 | 54 | 54 | 54 |
| | YDF-8170C | 0 | 0 | 0 | 44 | 0 | 0 | 0 | 0 | 0 | 0 | 0 |
| Curing agent | XLC-LL | 46 | 46 | 30 | 0 | 46 | 30 | 30 | 46 | 46 | 46 | 46 |
| | LF-2882 | 0 | 0 | 0 | 41 | 0 | 0 | 0 | 0 | 0 | 0 | 0 |
| Epoxy-group-containing acrylic copolymer | HTR-860P-3DR | 364 | 1889 | 264 | 43 | 122 | 0 | 181 | 1400 | 450 | 2200 | 450 |
| Curing promoter | 2PZ-CN | 0.2 | 0.6 | 0.1 | 0.3 | 0.1 | 0.1 | 0.1 | 0.3 | 0.3 | 0.3 | 0.3 |
| Coupling agent | A-1160 | 5 | 5 | 3 | 1 | 5 | 3 | 3 | 3 | 3 | 3 | 3 |
| Inorganic filler | SO-C2 | 185 | 820 | 122 | 143 | 32 | 122 | 0 | 450 | 122 | 2000 | 400 |
| | R972 | 32 | 385 | 21 | 0 | 0 | 21 | 0 | 50 | 21 | 50 | 50 |
| Low-molecular-weight polybutadiene | CTBNX-1300X9 | 36 | 0 | 0 | 0 | 0 | 0 | 0 | 0 | 0 | 0 | 0 |
| Breaking elongation (%) before the sheet was cured | | 15 | 17 | 27 | 4 | 20 | 2 | 130 | 90 | 53 | 35 | 30 |
| Elastic modulus (MPa) after the sheet was cured | | 6 | 5 | 5 | 417 | 57 | 900 | 0.5 | 4 | 8 | 12 | 15 |
| Cuttability of the adhesive sheet | | Good | Good | Good | Good | Good | Good | Bad | Bad | Bad | Good | Good |
| Embeddability into irregularities in the wiring board | | Good | Good | Good | Bad | Bad | Bad | Good | Good | Good | Bad | Bad |

The adhesive sheets of Examples 1 to 3 were each small in breaking elongation before the sheet was cured, good in cuttability, low in elastic modulus after the sheet was cured, and excellent in embeddability into irregularities in the wiring board. It is understood that the Comparative Examples 1, 2, 3, 7 and 8, which were each high in elastic modulus after the sheet was cured, were poor in embeddability into irregularities in the wiring board. It is understood that the adhesive sheets of Comparative Examples 4 to 6, which were each large in breaking elongation before the sheet was cured, was poor in cuttability.

The invention claimed is:

1. A dicing tape integrated adhesive sheet for a semiconductor, comprising a laminate of an adhesive sheet for a semiconductor having an adhesive layer and a dicing tape having a tacky layer, wherein the adhesive layer of the adhesive sheet for a semiconductor and the tacky layer of the dicing tape are joined with each other, the adhesive sheet for a semiconductor comprising a resin composition containing (i) a high-molecular-weight component and (ii) a filler, the filler comprising a first filler material having an average particle diameter of 0.005 to 0.1 μm and a second filler material having an average particle diameter of 0.4 to 0.6 μm,
wherein when the total amount of the resin composition is regarded as 100% by weight, the resin composition contains 50 to 65% by weight of the high-molecular-weight component and 27 to 50% by weight of the filler, and 2 to 13% by weight of the first filler material of the filler,
such that the breaking elongation of the adhesive sheet before the sheet is cured is 40% or less at 0° C., and such that the elastic modulus of the adhesive sheet after the curing is from 0.1 to 10 MPa at 175° C.

2. The dicing tape integrated adhesive sheet for a semiconductor according to claim 1, wherein the high-molecular-weight component has a Tg of −10 to 60° C. and a weight-average molecular weight of 20000 to 1000000.

3. The dicing tape integrated adhesive sheet for a semiconductor according to claim 1, wherein the high-molecular-weight component is selected from the group consisting of polyamide resins, polyimide resins, polyamideimide resins and acrylic copolymers.

4. The dicing tape integrated adhesive sheet for a semiconductor according to claim 1, wherein the high-molecular-weight component is selected from the group consisting of glycidyl acrylate and glycidyl methacrylate.

5. The dicing tape integrated adhesive sheet for a semiconductor according to claim 1, wherein the resin composition further contains a resin component.

6. The dicing tape integrated adhesive sheet for a semiconductor according to claim 5, wherein said resin component is selected from the group consisting of acrylic resins, methacrylic resins, phenoxy resins, epoxy resins, phenol resins, cresol resins and cyanate resins.

7. The dicing tape integrated adhesive sheet for a semiconductor according to claim 6, wherein the resin component is an epoxy resin.

8. The dicing tape integrated adhesive sheet for a semiconductor according to claim 1, wherein a peel strength between the adhesive sheet and the dicing tape is less than 150 N/m at a time of dicing using the dicing tape integrated adhesive sheet.

9. The dicing tape integrated adhesive sheet for a semiconductor according to claim 1, wherein said dicing tape includes a polytetrafluoroethylene film, a polyethylene terephthalate film, a polyethylene film, a polypropylene film, a polymethylpentene film or a polyimide film.

10. The dicing tape integrated adhesive sheet for a semiconductor according to claim 1, wherein the resin composition contains 50 to 65% by weight of the high-molecular-weight component and 27 to 40% by weight of the filler, when the total amount of the resin composition is regarded as 100% by weight.

11. The dicing tape integrated adhesive sheet for a semiconductor according to claim 1, wherein the adhesive sheet for a semiconductor further comprises a butadiene homopolymer or copolymer having a carboxyl group at a terminal end thereof, and the butadiene homopolymer or copolymer has a weight-average molecular weight of 1,000 to 10,000.

12. The dicing tape integrated adhesive sheet for a semiconductor according to claim 11, wherein said butadiene homopolymer or copolymer is an acrylonitrile polybutadiene copolymer having, at a terminal end thereof, a carboxyl group.

13. The dicing tape integrated adhesive sheet for a semiconductor according to claim 11, wherein the butadiene homopolymer or copolymer has a weight-average molecular weight of 3000 to 5000.

14. The dicing tape integrated adhesive sheet for a semiconductor according to claim 1, wherein in the resin composition the high molecular weight component is present in amount of 50-60% by weight, filler is present in an amount of 30-38% by weight, and the first filler material is present in an amount of 4-13% by weight.

15. A dicing tape integrated adhesive sheet for a semiconductor, comprising a laminate of an adhesive sheet for a semiconductor having an adhesive layer and a dicing tape having a tacky layer, wherein the adhesive layer of the adhesive sheet for a semiconductor and the tacky layer of the dicing tape are joined with each other, the adhesive sheet for a semiconductor comprising a resin composition containing (i) a high-molecular-weight component and (ii) a filler, the filler comprising a first filler material having an average particle diameter of 0.005 to 0.1 μm and a second filler material having an average particle diameter of 0.4 to 0.6 μm,
wherein when the total amount of the resin composition is regarded as 100% by weight, the resin composition contains 50 to 65% by weight of the high-molecular-weight component and 27 to 50% by weight of the filler, and 2 to 13% by weight of the first filler material of the filler,
such that the breaking elongation of the adhesive sheet before the sheet is cured is 40% or less at 0° C., and such that the elastic modulus of the adhesive sheet after the curing is from 0.1 to 10 MPa at 175° C., and
the filler is an inorganic filler.

16. The dicing tape integrated adhesive sheet for a semiconductor according to claim 15, wherein the high-molecular-weight component has a Tg of −10 to 60° C. and a weight-average molecular weight of 20000 to 1000000.

17. The dicing tape integrated adhesive sheet for a semiconductor according to claim 15, wherein the resin composition contains 50 to 65% by weight of the high-molecular-weight component and 27 to 40% by weight of the filler, when the total amount of the resin composition is regarded as 100% by weight.

18. The dicing tape integrated adhesive sheet for a semiconductor according to claim 15, wherein said dicing tape includes a polytetrafluoroethylene film, a polyethylene terephthalate film, a polyethylene film, a polypropylene film, a polymethylpentene film or a polyimide film.

19. The dicing tape integrated adhesive sheet for a semiconductor according to claim 15, wherein the adhesive sheet for a semiconductor further comprises a butadiene homopolymer or copolymer having a carboxyl group at a terminal end thereof, and the butadiene homopolymer or copolymer has a weight-average molecular weight of 1,000 to 10,000.

20. The dicing tape integrated adhesive sheet for a semiconductor according to claim 15, wherein in the resin composition the high molecular weight component is present in amount of 50-60% by weight, filler is present in an amount of 30-38% by weight, and the first filler material is present in an amount of 4-13% by weight.

21. The dicing tape integrated adhesive sheet for a semiconductor according to claim 19, wherein said butadiene homopolymer or copolymer is an acrylonitrile polybutadiene copolymer having, at a terminal end thereof, a carboxyl group.

22. The dicing tape integrated adhesive sheet for a semiconductor according to claim 19, wherein the butadiene homopolymer or copolymer has a weight-average molecular weight of 3000 to 5000.

* * * * *